United States Patent [19]
Kim et al.

[11] Patent Number: 5,833,870
[45] Date of Patent: Nov. 10, 1998

[54] METHOD FOR FORMING A HIGH DENSITY QUANTUM WIRE

[75] Inventors: Sung Bock Kim; Jeong Rae Ro; El Hang Lee, all of Taejon-Shi, Rep. of Korea

[73] Assignee: Electronics and Telecommunications Research Institute, Taejon-Sui, Rep. of Korea

[21] Appl. No.: 833,047

[22] Filed: Apr. 3, 1997

[30] Foreign Application Priority Data

Sep. 16, 1996 [KR] Rep. of Korea ............... 1996-40114

[51] Int. Cl.[6] .................................................... H01L 21/00
[52] U.S. Cl. ................................. 216/2; 216/24; 216/39; 438/705; 438/745
[58] Field of Search .................................. 216/2, 24, 39, 216/41, 83; 438/694, 700, 702, 703, 705, 745, 222, 223, 224

[56] References Cited

U.S. PATENT DOCUMENTS

| | | | |
|---|---|---|---|
| 4,652,333 | 3/1987 | Carney | 438/745 X |
| 4,676,863 | 6/1987 | Furuyama et al. | 438/745 X |

OTHER PUBLICATIONS

Wugen Pan, et al., Composition profile of an AIGaAs epilayer on a V–grooved substrate rown by low pressure metalorgnic vapor phase epitaxy, 14 Aug. 1995, pp. 959–961.

N. Usami, et al., Realization of crescent–shaped SiGe quantum wire structures on a V–groove patterned Si substrate by gas–source Si molecular am epitaxy, 15 Nov. 1993, pp. 2789–2791.

Wugen Pan, et al., Rectangular AIGaAs/AIAs Quantum Wires Using Spontaneous Vertical Quantum Wells, Feb. 1996, pp. 1214–1216.

*Primary Examiner*—William Powell
*Attorney, Agent, or Firm*—Cohen, Potani, Lieberman & Pontani

[57] ABSTRACT

A method for forming a highly dense quantum wire, the method comprising the steps of: depositing a dielectric mask having dielectric patterns on the top surface of a semiconductor (100) substrate; forming the dielectric patterns in parallel to a (011) orientation on the semiconductor substrate; exposing a $(1\bar{1}1)B$ side and a$(11\bar{1})B$ side by chemical etching a selected region between the patterns so that the semiconductor substrate has a dove-tail shape; forming a buffer layer on the dove-tail semiconductor substrate; forming the first barrier layer on the buffer layer; forming a well layer on the first barrier layer; and forming the second barrier layer on the well layer.

10 Claims, 2 Drawing Sheets

METHOD FOR FORMING A HIGH DENSITY QUANTUM WIRE

BACKGROUND OF THE INVENTION

1. Field of the Invention

The present invention generally relates to a method for forming a quantum wire. More particularly, this invention directs to a method for forming a quantum wire that utilizes a substrate etched away in dovetail geometry for increasing the density of the quantum wire by using a lithography and a growth technology.

2. Description of the Related Arts

High integration of integrated circuit elements makes it possible to manufacture higher speed and larger capacity of electronic devices. As semiconductor structure of a unit element becomes smaller and smaller, a quantum confinement effect is observed, and researches for developing devices utilizing such a quantum confinement effect have been widely carried out. In particular, rapid progress of semiconductor growth technology renders the thickness to be controlled in a level of single atomic layer, and, so, semiconductor lasers using a quantum well are already in common use. On the other hand, the growth of quantum wire which can provide improved efficiency than the quantum well has a limit due to the difficulty of controlling the sidewall thickness. In addition, what is to be solved in developing such devices using the quantum wire and the quantum dot is to increase the density of the device structure further.

The conventional growth technology of the quantum wire simply utilizes an electron beam or a photo lithography techniques, which has a limited density determined by the minimum feature size of the lithography. In the growth of the quantum wire, there have been proposed a number of approaches including an ex-situ technique such as a post-etching regrowth using an electron beam lithography and an ion beam implantation, and an in-situ technique such as a selective growth using a mask and a selective growth in which the quantum wire is grown depending on a crystal face using a non-planar substrate having, e.g., a ridge or a V-groove geometry. These techniques may be roughly explained as given below.

1) In the regrowth technique, a quantum well is initially grown, and the grown structure is etched away in submicron dimensions by using an electron beam lithography and an etching method, and then a barrier layer material is regrown. This regrowth approach is the most widely used, but it is difficult to obtain a line width of about 10 nano meters which is a limit where the quantum confinement effect is expected in the electron beam lithography, and the electron beam needs to be written one at a time to obtain each of the quantum wires. In addition to these defects, the density of the quantum wires is restricted by the minimum feature size of the lithography, and the electron beam is likely to cause a damage on the interfaces in the ex-situ formation, resulting in a degradation of the quantum efficiency.

2) In the ion beam implantation, the quantum well is also formed at first. However, dislike the regrowth approach, the barrier layer is grown by implanting the ion beam into the grown structure without the etching step. Although the etching and the regrowing steps can be omitted, because a pattern for the ion beam implantation must be prepared, the quantum wire has a density also limited by the lithography. Moreover, the interface may be damaged by the ion implantation.

3) The selective growth using the mask is an in-situ formation which can prevent the damage of the interface inevitably occurred in the above ex-situ formations. Micro patterns are formed on a substrate by a dielectric mask using the electron beam lithography and the etching method. On the micropatterned substrate is grown a compound semiconductor. Therefore, in the exposed region of the substrate, a semiconductor material is grown by absorbing the raw material, while the semiconductor material cannot grow on the dielectric mask. This selective growth of the semiconductor material makes it possible to form the quantum wire on a desired position. This approach has an advantage in that the growth is carried out on a clean surface, but the density of the quantum wire is restricted by the electron beam lithography limited by the patterning process to the substrate.

4) The selective growth using non-planar substrate is a technique in which a non-planar substrate is made first by using the lithography and the etching method, and then the quantum wire is grown onto the non-planar substrate. The non-planar substrate can be divided into two depending on the shapes: a ridge and a V-groove. The ridged substrate is employed mainly in MBE(Molecular Beam Epitaxy) growth, while the V-grooved substrate is commonly used in MOCVD(Metalorganic Chemical Vapor Deposition) or CBE(Chemical Beam Epitaxy). In this approach, the size of the sidewall can be effectively regulated by using anistrophy of growth rate on the different crystallographic orientation on the non-planar substrate.

This very widely used approach is defect free in the interfaces, and represents an improved property. However, the quantum wire has a limited density due to the lithography. As explained above, the existing quantum wire has a density entirely dependent upon the lithographical limit, which makes it difficult to reduce the quantum wire width to under submicron dimension. However, there is a need to manufacture higher dense quantum wire for quantum wire devices having more improved efficiency and a high power output.

SUMMARY OF THE INVENTION

In light of the above description, it is an object of the present invention to increase the density of a quantum wire in a simple and economical method by using existing lithography and growth techniques without introducing a new growth technology or requiring additional apparatus.

It is another object of the present invention to provide a method for forming a quantum wire which can reduce the production cost and improve the productivity.

According to a significant aspect of the present invention, a method for forming a quantum wire comprises the steps of: depositing a dielectric mask on a top surface of a semiconductor (100) substrate; forming patterns in parallel to a (011) orientation; exposing a ($1\bar{1}1$)B side and a ($11\bar{1}$)B side by chemical etching a selected region between the patterns so that the semiconductor substrate has a dove-tail shape; forming a buffer layer on the dove-tail semiconductor substrate;

forming the first barrier layer on the buffer layer;

forming a well layer on the first barrier layer; and forming the second barrier layer on the well layer.

BRIEF DESCRIPTION OF THE DRAWINGS

With the above and additional objects and advantages in mind as will hereinafter appear, the invention will be described with reference to the accompanying drawings, in which.

DETAILED DESCRIPTION OF THE PREFERRED EMBODIMENTS

Now the present invention will be explained in detail with reference to FIGS., 1A to 1E.

Figure 1A:
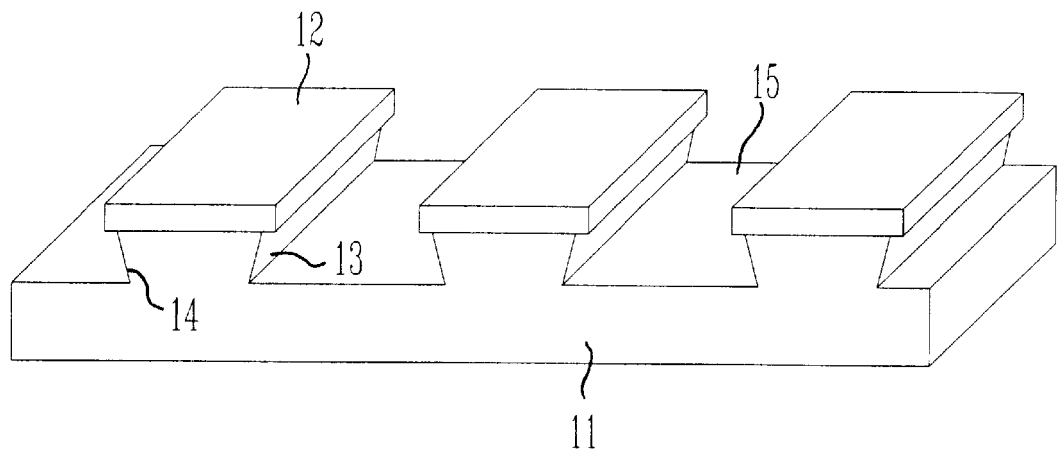
FIGS. 1A to 1E are cross sectional views for showing the processes for forming a high density quantum wire according to the present invention.

Referring to FIG. 1A, dielectric patterns are formed on a (100) semiconductor substrate 11 in parallel to (011) orientation by using a dielectric mask 12. This patterning process is carried out by a CVD process for depositing a dielectric thin film and by a lithography. By chemical etching the patterned substrate 11, a dove-tail substrate 15 with (1$\bar{1}$1)B side and (11$\bar{1}$)B side exposed. A solution for the chemical etching is composed of $H_2SO_4$, $H_2O_2$ and $H_2O$ in a ratio of 1 to 8 to 40.

Figure 1B:
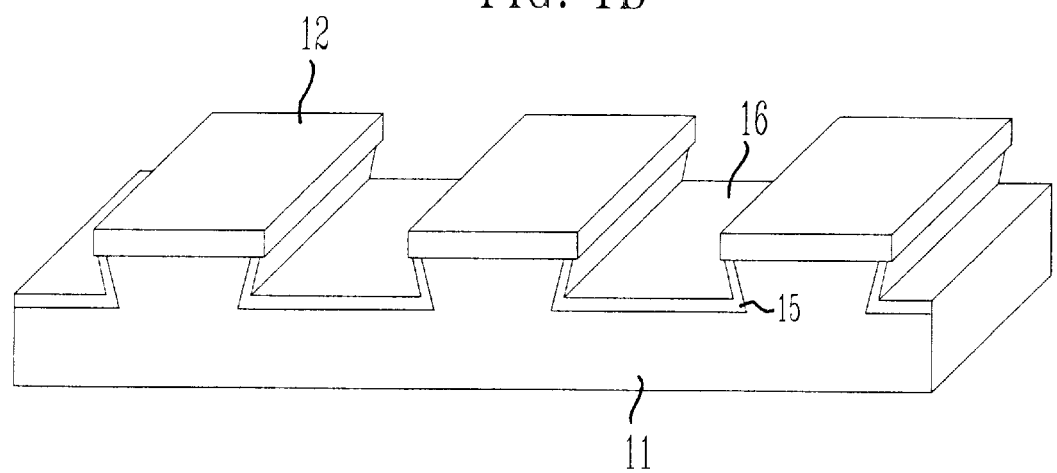

FIG. 1B is a cross sectional view of the dove-tail substrate 15 on which a buffer layer 16 is formed.

Uniform and defect free thin film can be formed by using CVD, MOCVD or CBE growth technology in which the source of the thin film is provide in a gas state. At this time, the growth condition is so chosen for the source gas to arrive the ends of the dove-tail through a surface migration of the gas.

Figure 1C:
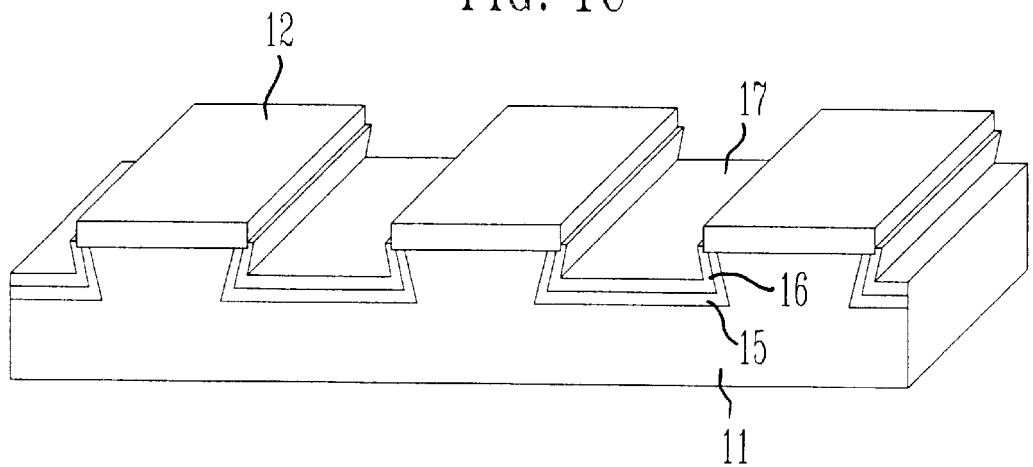

FIG. 1C is a cross sectional view of a structure in which a uniform first barrier layer 17 is formed on the buffer layer 16. The first barrier layer 17 is identical to GaAs barrier layer in In GaAs/GaAs structure. In case of GaAs/AlGaAs counterpart, AlGaAs is uniformly formed on the buffer layer 16 as the first barrier layer.

Figure 1D:
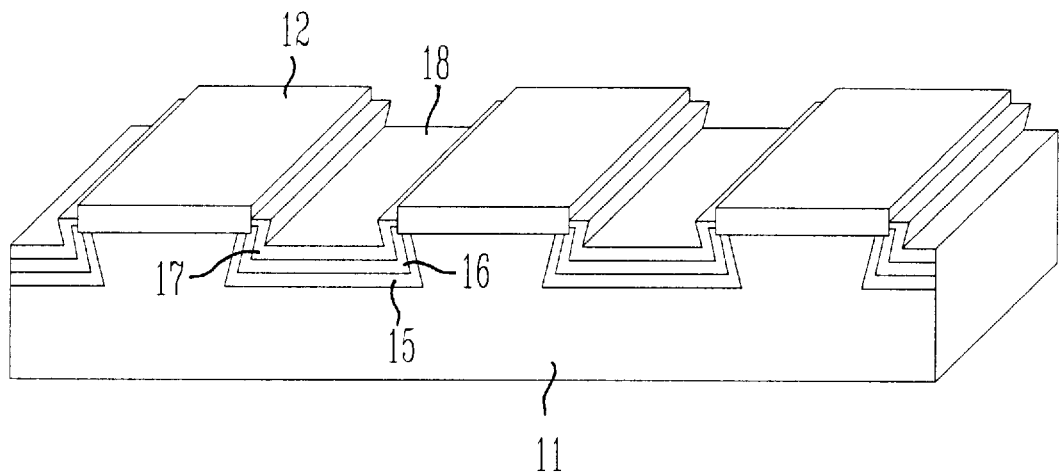

FIG. 1D is a cross sectional view of a structure having a well layer 18 formed on the first barrier layer 17. The well layer 18 needs to be formed to have a thickness less than 10 nano meters for obtaining the quantum confinement effect. In the case of compound semiconductor like InGaAs/GaAs quamtum wire, with the well layer of InGaAs, because the distance of surface migration of an In adatom is greater than that of an Ga adatom, the ratio of In is very high in edge regions of the dove-tail, which allows the well layer to have very low energy band gap. When CBE method is used in this case, the growth temperature of 450° C. are sufficient to initiate the surface migration of the In. Accordingly, two well layers are formed in a single etched structure resulting in a twice dense well layer within minimum line width of the lithography and in a high density of the quantum wire. When binary compound semiconductor like GaAs or InAs is used as well material, the surface migration of the source gas causes the ingredient to be stacked in edge regions of the dove-tail.

The thin film has a concave geometry, and, hence, two well layers can be grown in a single etched dove-tail structure. This makes possible to grow the well layer densely twice than the conventional method.

Figure 1E:
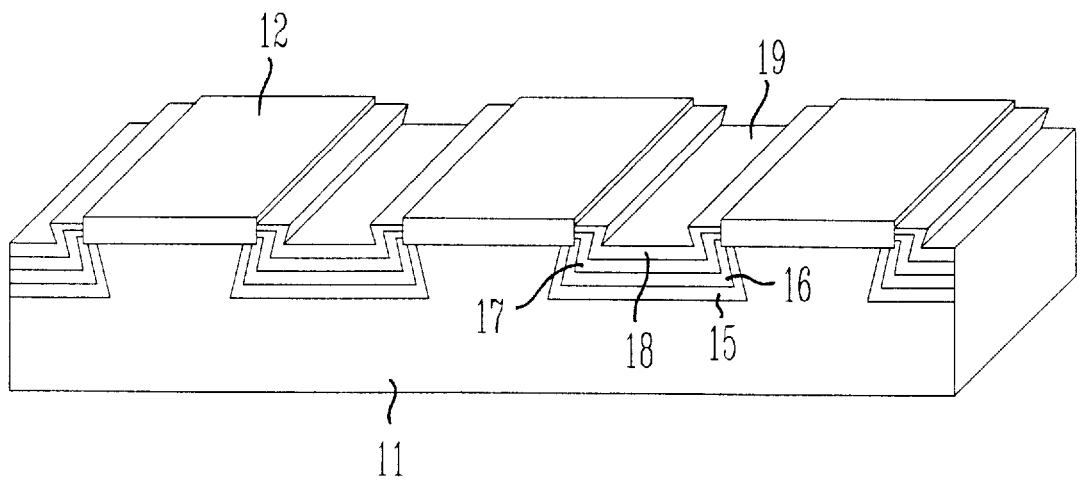

FIG. 1E shows a structure in which the second barrier layer 19 is formed on the well layer 18. This can be obtained by repeating the process as shown in FIG. 1C. In case of InGaAs/GaAs, GaAs is grown, while AlGaAs is grown on AlGaAs/GaAs structure. When AlGaAs/GaAs is used, it is preferable to form a cap layer of thin GaAs layer for preventing an oxidation of the AlGaAs layer. With this process, electrons are confined two-dimensionally in edge regions of the etched dove-tail. As a result, the quantum wire have a density increased twice than the conventional method where two quantum wires are formed in a single etched substrate.

If the processes shown in FIGS. 1D and 1E are repeatedly carried out, stacking of the quantum wires are possible.

As explained above, since the present invention utilizes the existing lithography technology in forming a high density quantum wire aligned to edge regions of the dove-tail, process steps such as an electrode making step in electronic devices or in opto-electronic devices can be performed without changed.

With the present invention, a quantum wire having higher density than the existing quantum wire is provided by using a conventional photolithography technique and the surface migration effect of source gases of compound semiconductor materials.

Accordingly, the present invention enables a laser having high efficiency and low threshold current characteristics. Moreover, the present invention can be applied to a high responsive device as well as to a quantum device which operates stably in a room temperature. Further, a cost down and an improvement of productivity are expected due to the fact that the conventional apparatus for forming the quantum wire can be employed without any modification.

Numerous alterations and modifications of the structure herein disclosed will present themselves to those skilled in the art. However, it is to be understood that the above described embodiments are for purposes of illustration only and not to be construed as a limitation of the present invention. All such modifications which do not depart from the spirit of the present invention are intended to be included within the scope of the appended claims.

What is claimed is:

1. A method for forming a quantum wire, comprising the steps of:

depositing a dielectric mask having dielectric patterns on a top surface of a semiconductor (100) substrate;

forming the dielectric patterns in parallel to a (011) orientation on the semiconductor substrate;

exposing a (1$\bar{1}$1)B side and a (11$\bar{1}$)B side by chemical etching a selected region between the patterns so that the semiconductor substrate has a dove-tail shape;

forming a buffer layer on the dove-tail semiconductor substrate;

forming a first barrier layer on the buffer layer; forming a well layer on the first barrier layer; and forming a second barrier layer on the well layer.

2. The method for forming a quantum wire as claimed in claim 1, wherein said di-electric patterns are obtained by a chemical vapor deposition process and a lithography process.

3. The method for forming a quantum wire as claimed in claim 1, wherein said buffer layer is formed by a process of CVD (Chemical Vapor Deposition), MOCVD (Metalorganic CVD) or CBE (Chemical Beam Epitaxy).

4. The method for forming a quantum wire as claimed in claim 1, wherein the buffer layer is made of a material selected from a group consisting GaAs, InP, Si, InAs, GaAb, sapphire and SiC.

5. The method for forming a quantum wire as claimed in claim 1, wherein the first barrier layer is grown by a process of CVD (Chemical Vapor Deposition), MOCVD (Metalorganic CVD) or CBE (Chemical Beam Epitaxy).

6. The method for forming a quantum wire as claimed in claim 1, wherein the well layer is formed to have a thickness of less than 10 nano meters.

7. The method for forming a quantum wire as claimed in claim 1, wherein the well layer is formed by a composition of semiconductor materials of three elements.

8. The method for forming a quantum wire as claimed in claim 7, wherein the semiconductor material is selected from a group consisting InGaAs, AlGaAs, InGaP, InGaAsP and AlGaAsP.

9. The method for forming a quantum wire as claimed in claim 1, wherein the well layer is formed by a composition of a semiconductor material of two or less elements.

10. The method for forming a quantum wire as claimed in claim 9, wherein the semi-conductor material is selected from a group consisting GaAs, Inp and Ge.

* * * * *